United States Patent
Hirata et al.

(10) Patent No.: US 8,013,075 B2
(45) Date of Patent: Sep. 6, 2011

(54) CURABLE COMPOSITION

(75) Inventors: Kei Hirata, Ibaraki (JP); Koji Kitayama, Ibaraki (JP); Mizuho Maeda, Ibaraki (JP)

(73) Assignee: Kuraray Co., Ltd., Kurashiki-shi (JP)

( * ) Notice: Subject to any disclaimer, the term of this patent is extended or adjusted under 35 U.S.C. 154(b) by 1143 days.

(21) Appl. No.: 10/545,807

(22) PCT Filed: Feb. 17, 2004

(86) PCT No.: PCT/JP2004/001708
§ 371 (c)(1),
(2), (4) Date: Aug. 16, 2005

(87) PCT Pub. No.: WO2004/076558
PCT Pub. Date: Sep. 10, 2004

(65) Prior Publication Data
US 2006/0194923 A1     Aug. 31, 2006

(30) Foreign Application Priority Data

Feb. 28, 2003 (JP) ................................. 2003-054354
Apr. 11, 2003 (JP) ................................. 2003-107892

(51) Int. Cl.
*C08C 19/00* (2006.01)
*C08L 63/00* (2006.01)
*C08L 37/00* (2006.01)

(52) U.S. Cl. .................... 525/383; 525/524; 525/208
(58) Field of Classification Search .......... 525/408, 525/208, 383, 524
See application file for complete search history.

(56) References Cited

U.S. PATENT DOCUMENTS

| | | | |
|---|---|---|---|
| 3,217,066 A | | 11/1965 | Greenspan et al. |
| H1517 H | * | 2/1996 | Erickson et al. ............... 522/170 |
| 5,536,772 A | * | 7/1996 | Dillman et al. ............... 524/483 |
| 5,612,407 A | * | 3/1997 | Southwick ................... 524/571 |
| 5,922,467 A | * | 7/1999 | St. Clair ...................... 428/418 |
| 6,121,386 A | * | 9/2000 | Ohtsuka et al. ............... 525/408 |
| 6,525,142 B1 | * | 2/2003 | Erickson et al. .............. 525/314 |
| 2002/0077427 A1 | * | 6/2002 | Hideyuki ..................... 525/331.7 |

FOREIGN PATENT DOCUMENTS

| | | | |
|---|---|---|---|
| EP | 0601665 | * | 6/1994 |
| JP | 61-42504 | | 3/1986 |
| JP | 61-051024 | | 3/1986 |
| JP | 64-14208 | | 1/1989 |
| JP | 08-134135 | | 5/1996 |
| JP | 11-80681 | | 3/1999 |
| JP | 11-214813 | | 8/1999 |
| JP | 2000-104035 | | 4/2000 |
| JP | 2002-249516 | | 9/2002 |
| WO | 01/29134 | | 4/2001 |

OTHER PUBLICATIONS

"National Industrial Chemicals Notification and Assessment Scheme". Feb. 2001. pp. 1-22.*
English translation of JP2000-104035.*
Ghilardi et al. "Five-co-ordinate Methylmercury and Trimethyltin Palladium and Platinum Complexes. X-Ray Crystal Structure of [N(CH2CH2PPh2)3Pt(HgMe)]BPh4", J. Chem. Soc., Chem. Commun., pp. 1686-1688 1989.
Jian et al. "Epoxidation of Unsaturated Polymers with Hydrogen Peroxide", J. Polym. Sci. Part C. vol. 28, pp. 285-288 1990.

* cited by examiner

*Primary Examiner* — Mark Eashoo
*Assistant Examiner* — Megan McCulley
(74) *Attorney, Agent, or Firm* — Oblon, Spivak, McClelland, Maier & Neustadt, L.L.P.

(57) ABSTRACT

A curable composition includes (A) a (meth)acrylate, (B) a radical polymerization initiator, (C) an epoxidized polyisoprene containing an epoxy group at 0.15 to 2.5 meq/g in the molecule and having a number-average molecular weight of 15000 to 200000, and (D) a curing accelerator. The curable composition shows high elongation and excellent rubber elasticity even in a cured state and has superior compatibility, transparency, waterproofness and flexibility, so that cracks and separation of cured products are reduced. Accordingly, the composition is suitable for use as adhesives, coating agents, encapsulating materials, inks, sealing materials and the like.

9 Claims, No Drawings

CURABLE COMPOSITION

FIELD OF THE INVENTION

The present invention relates to a curable composition. The curable composition of the invention has excellent compatibility, transparency, flexibility and waterproofness, and is useful for use as adhesives, coating agents, encapsulating materials, inks and sealing materials.

BACKGROUND OF THE INVENTION

Curing technology involving activation energy rays such as electron beams and ultraviolet rays is important in the fields of adhesives, coating agents, encapsulating materials, inks and sealing materials from the viewpoints of recent organic solvent emission control and reduction of consumption of production energy. The adhesives, coating agents, encapsulating materials and inks used in precision parts such as electric and electronic parts are most often hygroscopic and contain water, so that their use in water-hating precision parts is generally difficult. Even if the use is possible, the following problem is encountered: the precision parts are subjected to elevated temperatures of 200° C. or above in the soldering or other processing, so that the water contained in the layer of adhesive, coating agent, encapsulating material or ink is rapidly evaporated to cause internal stress, resulting in cracks in the layer of adhesive, coating agent, encapsulating material or ink. This evaporation of water in the coating agents, inks and sealing materials is also a cause of cracks and separation of layers in the fields of coating agents, inks and sealing materials for use in other than precision parts. Accordingly, there has been an increasing need for a material having flexibility, high elongation, excellent adhesion to metals and good waterproofness.

The curing technologies in the above-mentioned fields are largely classified into: radical photocuring technology in which a monomer or an oligomer being a polyfunctional acrylate or an unsaturated polyester is cured with an activation energy ray such as UV ray in the presence of a radical photopolymerization initiator, or radical heat curing technology in which the above monomer or oligomer is cured by heat in the presence of a thermally decomposable radical polymerization initiator; cationic photocuring technology in which a monomer or an oligomer being an epoxy compound or an oxetane compound is cured with an activation energy ray such as UV ray in the presence of a cationic photopolymerization initiator; and heat curing technology in which the above monomer or oligomer is cured by heating in the presence of an acid anhydride, an amine compound, a phosphine compound or a phenolic resin.

The radical photocuring technology has characteristics of a high curing rate of composition and a wide variety of applicable monomers and oligomers to permit preparation of cured products with various properties. However, the polymerization is easily inhibited by air oxygen, and the monomers and oligomers used are highly toxic and possess strong odor and skin irritation.

Characteristics of the cationic photocuring technology include small shrinkage of a composition cured with an activation energy ray such as UV ray, and cured products having good adhesion with metals. However, the curing rate is low and the variety of monomers and oligomers employable is limited.

The radical heat curing and the heat curing technologies can cure deep inside a composition that the activation energy rays such as UV rays do not reach, but they have a problem of short pot life.

Accordingly, it has been difficult that a curable composition is cured by any single technology of the aforesaid while satisfying two or more of the characteristics of a high curing rate, small shrinkage when cured, and good adhesion with metals.

To solve the above problems, means proposed include (1) a photocurable resin composition for sealing that essentially contains a resin whose main chain skeleton is composed of a butadiene homopolymer or a butadiene copolymer and which has an average of at least 1.5 epoxy groups in a molecular terminal and/or a side chain per molecule, an epoxy resin, an acrylate or a methacrylate, and a photosensitive aromatic onium salt (JP-A-S61-51024); (2) a resin paste composition that contains an acrylate or a methacrylate compound, an epoxidized polybutadiene, a radical initiator, and a filler (JP-A-2000-104035); and (3) an insulating resin composition for multilayer printed wiring board that contains at least: a photocurable resin being a UV curable resin that is obtained by reaction of a reaction product between a bisphenol epoxy resin compound and an unsaturated monocarboxylic acid, with a saturated or unsaturated polybasic acid anhydride; a thermosetting component being a polyfunctional epoxy resin; a polybutadiene in which part of double bonds remaining in the molecule is epoxidized; an epoxy compound having a photocurable component and a thermosetting component; a photopolymerization initiator; and a filler, wherein the insulating resin composition is developable by a dilute alkaline solution and has photocurable and thermosetting properties (JP-A-H11-214813).

The compositions of (1) to (3) have a common technical idea that flexibility is imparted by the epoxy-modified polybutadiene and the curable resin compositions are curable by two or more curing technologies in combination to achieve combined characteristics of these technologies. The curable compositions disclosed possess good adhesion and high curing rate. The resin whose main chain skeleton is composed of a butadiene homopolymer or a butadiene copolymer and which has an average of at least 1.5 epoxy groups in a molecular terminal and/or a side chain per molecule, which is disclosed to be substantially useful in (1), is for example an epoxidized polybutadiene (Examples disclose a molecular weight of 1500 and an epoxy oxirane oxygen content of 7.7% (corresponding to an epoxy number of 4.8 meq/g)) that is highly modified or contains an epoxy group at a molecular terminal. The epoxidized polybutadiene, which is disclosed to be substantially useful in (2), has a preferable epoxy equivalent of 50 to 500 (corresponding to an epoxy number of 20 to 2 meq/g) and is highly modified (Examples disclose epoxy equivalents of 152.4 to 177.8 (corresponding to epoxy numbers of 6.6 to 5.6 meq/g)). The polybutadiene in which part of double bonds remaining in the molecule is epoxidized, which is disclosed to be substantially useful in (3), has a preferable epoxy equivalent of 150 to 250 (corresponding to an epoxy number of 6.7 to 4 meq/g) and is highly modified.

When such highly epoxidized polybutadienes are cured, the crosslink density is increased and the cured products cannot display adequate flexibility. Further, the epoxy-terminated epoxidized polybutadiene, which is generally produced by reaction with epichlorohydrin, contains large amounts of impurities such as by-product chloride ions, so that the epoxy resin composition shows lowered humidity resistance and exhibits a corrosive action when used in contact with metal parts.

It is therefore an object of the present invention to provide a curable composition that shows high elongation and excellent rubber elasticity even in a cured state and has superior compatibility, transparency, flexibility and waterproofness.

DISCLOSURE OF THE INVENTION

To achieve the above object, the invention provides a curable composition comprising (A) a (meth)acrylate, (B) a radical polymerization initiator, (C) an epoxidized polyisoprene containing an epoxy group at 0.15 to 2.5 meq/g in the molecule and having a number-average molecular weight of 15000 to 200000 (hereinafter the epoxidized polyisoprene (C)), and (D) a curing accelerator.

PREFERRED EMBODIMENTS OF THE INVENTION

The (meth)acrylate (A) for the curable composition is not particularly limited as long as it is curable by the radical polymerization initiator (B). Examples thereof include dicyclopentenyl (meth)acrylate, isobornyl (meth)acrylate, 2-hydroxypropyl (meth)acrylate, morpholine (meth)acrylate, phenoxyethyl (meth)acrylate, n-butyl (meth)acrylate and 2-ethylhexyl (meth)acrylate. These (meth)acrylates may be used singly or in combination of two or more kinds.

As used herein, the radical polymerization initiator (B) for the curable composition is a radical photopolymerization initiator that generates radicals by being decomposed by activation energy rays such as UV rays, or a thermally decomposable radical polymerization initiator that generates radicals by being thermally decomposed. The radical photopolymerization initiators include acetophenone derivatives such as 2-hydroxy-2-methylpropiophenone and 1-hydroxycyclohexyl phenyl ketone; acylphosphine oxide derivatives such as bis(2,4,6-trimethylbenzoyl) phenylphosphine oxide; and benzoin ether derivatives such as benzoin methyl ether and benzoin ethyl ether. The thermally decomposable radical polymerization initiators include peroxides such as 1,1,3,3-tetramethylbutyl peroxy-2-ethylhexanoate, 1,1-bis(t-butylperoxy) cyclohexane, 1,1-bis(t-butylperoxy)cyclododecane, di-t-butyl peroxyisophthalate, t-butyl peroxybenzoate, dicumyl peroxide, t-butyl cumyl peroxide, 2,5-dimethyl-2,5-di(t-butylperoxy) hexane, 2,5-dimethyl-2,5-di(t-butylperoxy)-3-hexyne and cumene hydroperoxide. The amount of the radical polymerization initiator (B) is not particularly restricted, and is preferably in the range of 0.01 to 20 parts by mass per 100 parts by mass of the (meth)acrylate (A).

The epoxidized-polyisoprene (C) for the curable composition is required to contain an epoxy group at 0.15 to 2.5 meq/g in the molecule and have a number-average molecular weight of 15000 to 200000.

The epoxy group content of the epoxidized polyisoprene (C) is more preferably in the range of 0.15 to 2 meq/g. When the epoxidized polyisoprene (C) has an epoxy group content of less than 0.15 meq/g, it shows low compatibility with the (meth)acrylate (A), and the composition becomes heterogeneous with phase separation. On the other hand, the content exceeding 2.5 meq/g leads to a cured product in which the epoxidized polyisoprene (C) has dense crosslinking points, so that the cured product loses the rubber elasticity and becomes less flexible.

The number-average molecular weight of the epoxidized polyisoprene (C) is more preferably in the range of 15000 to 50000. When the number-average molecular weight is lower than 15000, the cured product has insufficient flexibility. On the other hand, when the number-average molecular weight exceeds 200000, the viscosity of the epoxidized polyisoprene (C) is so increased that the workability in preparation of the curable composition is deteriorated.

As used herein, the number-average molecular weight is in terms of polystyrene according to gel permeation chromatography (GPC).

The mixing ratio by mass of the (meth)acrylate (A) and the epoxidized polyisoprene (C) is preferably in the range of 10/90 to 90/10, and more preferably in the range of 10/90 to 50/50. When the (meth)acrylate (A)/epoxidized polyisoprene (C) mixing ratio by mass is not within 10/90, namely, when the epoxidized polyisoprene (C) is used at above 90% by mass, the rubber elasticity tends to be poor. When the (meth)acrylate (A)/epoxidized polyisoprene (C) mixing ratio by mass is not within 90/10, namely, when the epoxidized polyisoprene (C) is used at below 10% by mass, the curable composition tends to give a cured product having insufficient elongation properties.

There is particularly no limitation on the process for producing polyisoprene that is a material of the epoxidized polyisoprene (C). For example, anionic polymerization and Ziegler processes can be used. The anionic polymerization of isoprene may be performed in an inert gas atmosphere such as argon or nitrogen, in a solvent inactive in the polymerization such as hexane, cyclohexane, benzene or toluene, with use of an initiator such as an alkali metal (e.g., metallic sodium or metallic lithium) or an alkyllithium compound (e.g., methyllithium, ethyllithium, n-butyllithium or s-butyllithium), at a polymerization temperature of −100 to 100° C., and over a period of 0.01 to 200 hours.

Subsequently, the polyisoprene obtained is epoxidized at a carbon-carbon double bond to give an epoxidized polyisoprene (C). The process of epoxidation is not particularly limited, and exemplary processes include (i) treatment with a peracid such as peracetic acid (JP-A-H08-134135), (ii) treatment with a molybdenum complex and t-butylhydroperoxide (J. Chem. Soc., Chem. Commun., P. 1686 (1989)), (iii) treatment with a tungstic acid catalyst and hydrogen peroxide (J. Polym. Sci., C, Vol. 28, P. 285 (1990)), and (iv) treatment with a tungsten compound selected from ammonium tungstate and phosphotungstic acid, a quaternary ammonium salt, phosphoric acid, and an aqueous hydrogen peroxide solution (JP-A-2002-249516).

The curing accelerator (D) for the curable composition is preferably at least one compound selected from the group consisting of acid anhydrides, basic compounds and cationic photopolymerization initiators. Particularly preferably, the curing accelerator as used herein refers to a cationic photopolymerization initiator that generates a strong acid by being decomposed with activation energy rays such as UV rays.

The acid anhydrides include dodecenyl succinic anhydride, polyadipic anhydride, polyazelaic anhydride, methyltetrahydrophthalic anhydride, hexahydrophthalic anhydride, tetrahydrophthalic anhydride and methylcyclohexenedicarboxylic anhydride. The basic compounds include phosphine compounds such as triphenylphosphine, tris(dimethoxyphenyl) phosphine and dibutylphenylphosphine; and amine compounds such as diethylenetriamine, triethylenetetramine and tetraethylenepentamine.

The cationic photopolymerization initiators include aromatic diazonium salts such as P-33 (trade name, manufactured by ASAHI DENKA CO., LTD.); aromatic iodonium salts such as Rhodorsil-2074 (trade name, manufactured by Rhodia Japan, Ltd.) and CD-1012 (trade name, manufactured by Sartomer Company, Inc.); aromatic sulfonium salts such as FC-512 and FC-509 (trade names, manufactured by 3M Company), CD-1011 (trade name, manufactured by Sartomer Company, Inc.), DAICAT 11 (trade name, manufactured by DAICEL CHEMICAL INDUSTRIES, LTD.) and SP-150 and SP-170 (trade names, manufactured by ASAHI DENKA CO., LTD.); and metallocene compounds such as IRGACURE 261 (trade name, manufactured by CIBA SPECIALTY CHEMICALS). These curing accelerators may be used singly or in combination of two or more kinds.

The curing accelerator (D) is preferably used in an amount of 0.01 to 20 parts by mass, and more preferably 0.5 to 10 parts by mass per 100 parts by mass of the epoxidized polyisoprene (C). Insufficient curing properties tend to result when the amount of the curing accelerator (D) is less than 0.01 part by mass per 100 parts by mass of the epoxidized polyisoprene (C). The use of the curing accelerator in an amount larger than 20 parts by mass does not much improve the curing properties of the curable composition and tends to result in bad economic efficiency.

The curable composition according to the invention may contain tackifiers, plasticizers, antioxidants, ultraviolet light absorbers, softening agents, anti-foaming agents, pigments, dyes, organic fillers and perfumes, while still satisfying its properties.

To prepare the curable composition, the (meth)acrylate (A), the radical polymerization initiator (B), the epoxidized polyisoprene (C), the curing accelerator (D) and the additives required may be mixed at room temperature using conventional mixing means such as a stirring machine or a kneader.

The curable composition may be cured by irradiation with activation energy rays, with application of heat during or after the curing as required. The activation energy rays include corpuscular beams, electromagnetic waves and combinations thereof. The corpuscular beams include electron beams (EB) and α rays. The electromagnetic waves include ultraviolet (UV) rays, visible rays, infrared rays, γ rays and X rays. Of theses electron beams (EB) and ultraviolet (UV) rays are preferable.

The activation energy rays may be radiated using a known apparatus. For the electron beams (EB), the accelerating voltage and the irradiation dose are suitably in the range of 0.1 to 10 MeV and 1 to 500 kGy, respectively. A 200-450 nm wavelength lamp can be suitably used as an ultraviolet (UV) radiation source. The electron beam (EB) sources include tungsten filaments, and the ultraviolet (UV) sources include low-pressure mercury lamps, high-pressure mercury lamps, ultrahigh-pressure mercury lamps, halogen lamps, excimer lamps, carbon arc lamps, xenon lamps, zirconium lamps, fluorescent lamps and sun's ultraviolet rays. The curable composition is generally irradiated with the activation energy rays for 0.5 to 300 seconds, although variable depending on the magnitude of the energy.

The curable composition of the present invention shows high elongation and excellent rubber elasticity even in a cured state and has superior compatibility, transparency, waterproofness and flexibility, so that cracks and separation of cured products are reduced. Accordingly, the composition is suitable for use as adhesives, coating agents, encapsulating materials, inks, sealing materials and the like. The applications as adhesives include lamination of optical disks such as digital versatile disks (DVDs); bonding of optical lenses used in cameras and optical heads for playing DVDs and compact disks (CDs); bonding of optical members such as optical fibers; bonding of precision parts such as semiconductors with printed wiring boards; and use as dicing tapes for fixing wafers in the dicing step of semiconductor production. The applications as coating agents include coating of automobile head lamps; and coating of optical fibers. The applications as encapsulating materials include encapsulation of precision parts such as liquid crystal display elements and semiconductors. The applications as inks include resist inks used in the fabrication of semiconductors and printed wiring boards, and printing inks for printing on aluminum foil paper, polyethylene-coated paper, vinyl chloride sheets, polyester sheets, polypropylene sheets, food cans and beverage cans. The applications as sealing materials include sealing in automobile bodies and buildings.

The curable composition provided by the invention can give a cured product that shows excellent rubber elasticity and has superior compatibility, transparency, flexibility and waterproofness.

EXAMPLES

The present invention will be hereinafter described in greater detail by Examples, but it should be construed that the invention is in no way limited to those Examples. The curable compositions in Examples and Comparative Examples were evaluated for properties as described below.

[1] Compatibility

The curable compositions obtained in Examples and Comparative Examples were visually evaluated for homogeneity.
AA: Good compatibility (the composition was homogeneous)
BB: Turbidity
CC: Phase separation

[2] Transparency of Cured Product

The curable compositions obtained in Examples and Comparative Examples were each poured into a 0.8 mm thick mold, and the surface of the composition was covered with a 0.2 mm thick polypropylene sheet. Subsequently, the composition was irradiated with ultraviolet rays for 30 seconds with use of a high-pressure mercury lamp (30 W/cm) arranged 20 cm apart from the polypropylene sheet. The composition was then allowed to stand for 30 minutes in a thermostatic chamber temperature controlled at 60° C. to give a cured product. The polypropylene sheet was removed from the cured product, and the transparency was visually evaluated.
AA: Good transparency
BB: Turbidity
CC: No transparency

[3] Break Strength and Break Elongation

The cured products obtained by removing the polypropylene sheet in [2] were each allowed to stand in a 25° C. atmosphere for 24 hours. Subsequently, test specimens 60 mm long by 6 mm wide by 0.8 mm thick were prepared from the cured products. They were tensile tested at a stress rate of 10 mm/min to determine the break strength and the break elongation.

[4] Hardness 10 pieces of the cured products obtained by removing the polypropylene sheet in [2] were laminated together to a thickness of 8 mm, and the hardness was determined with a Type A durometer in accordance with JIS K 6253.

[5] Water Absorption

Test specimens 3 cm long by 3 cm wide by 0.8 mm thick were prepared from the cured products obtained by removing the polypropylene sheet in [2]. They were vacuum dried at 80° C. for 12 hours and were measured for mass. The specimens were then immersed in 25° C. water for 24 hours and were taken out, and the water droplets on the surface were all wiped with a towel. The mass was measured again to determine the water absorption based on the mass increase relative to the original.

The components employed in Examples and Comparative Examples are the following.

(Meth)acrylate (A)

FA-511A (trade name, manufactured by HITACHI CHEMICAL CO., LTD.) (dicyclopentenyl acrylate)

Radical Photopolymerization Initiator (B)

DAROCUR 1173 (trade name, manufactured by CIBA SPECIALTY CHEMICALS) (2-hydroxy-2-methylpropiophenone)

Epoxidized Polyisoprene (C)

Reference Example 1

(1) A 5-liter autoclave purged with nitrogen was charged with 2000 g of hexane and 2.5 g of n-butyllithium, followed by heating to 50° C. Subsequently, 650 g of isoprene was added and polymerization was carried out for 3 hours. Part of the reaction liquid was sampled to analyze the product by GPC, which showed that a polyisoprene had occurred which had a number-average molecular weight (Mn) of 27000 in terms of polystyrene, and a molecular weight distribution (Mw/Mn) of 1.16.

(2) 300 g of the polymerization solution obtained in (1) above was washed with water and was introduced into a 1-liter autoclave. Further, 0.05 g of phosphotungstic acid, 0.05 g of phosphoric acid, 4.5 g of a 35% by mass aqueous solution of hydrogen peroxide, 90 g of water and 0.09 g of trioctylmethylammonium chloride were added, and reaction was performed at 80° C. for 3 hours. The resulting reaction liquid was poured into methanol to reprecipitate the polymer, and the polymer was filtered out and was vacuum dried at 80° C. for 7 hours to give 70 g of an epoxidized polyisoprene (hereinafter abbreviated to e-IR-1). GPC analysis of e-IR-1 resulted in Mn=27300 and Mw/Mn=1.16. Approximately 0.5 g of e-IR-1 was weighed out and was dissolved in 10 ml of tetrahydrofuran (THF) at 25° C. The solution was combined with 10 ml of a solution of 0.2N hydrochloric acid in THF, and the mixture was stirred for 30 minutes to perform reaction of the epoxy group in e-IR-1 with the hydrochloric acid. The excess of hydrochloric acid was titrated using a solution of 0.1N potassium hydroxide in ethanol to determine the epoxy number to be 0.5 meq/g. (This process will be hereinafter referred to as the back titration of hydrochloric acid.)

Reference Example 2

300 g of a polyisoprene solution obtained in the same manner as in Reference Example 1 (1) was washed with water and was introduced into a 1-liter autoclave. Further, 0.16 g of phosphotungstic acid, 0.15 g of phosphoric acid, 13 g of a 35% by mass aqueous solution of hydrogen peroxide, 90 g of water and 0.26 g of trioctylmethylammonium chloride were added, and reaction was performed at 80° C. for 3 hours. The resulting reaction liquid was poured into methanol to reprecipitate the polymer, and the polymer was filtered out and was vacuum dried at 80° C. for 7 hours to give 70 g of an epoxidized polyisoprene (hereinafter abbreviated to e-IR-2). GPC analysis of e-IR-2 resulted in Mn=27600 and Mw/Mn=1.16. The back titration of hydrochloric acid was carried out in the same manner as in Reference Example 1 (2), and the epoxy number was determined to be 1.5 meq/g.

Reference Example 3

300 g of a polyisoprene solution obtained in the same manner as in Reference Example 1 (1) was washed with water and was introduced into a 1-liter autoclave. Further, 0.27 g of phosphotungstic acid, 0.25 g of phosphoric acid, 22 g of a 35% by mass aqueous solution of hydrogen peroxide, 90 g of water and 0.43 g of trioctylmethylammonium chloride were added, and reaction was performed at 80° C. for 3 hours. The resulting reaction liquid was poured into methanol to reprecipitate the polymer, and the polymer was filtered out and was vacuum dried at 80° C. for 7 hours to give 70 g of an epoxidized polyisoprene (hereinafter abbreviated to e-IR-3). GPC analysis of e-IR-3 resulted in Mn=28000 and Mw/Mn=1.18. The back titration of hydrochloric acid was carried out in the same manner as in Reference Example 1 (2), and the epoxy number was determined to be 2.4 meq/g.

Curing Accelerator (D)

Rhodorsil-2074 (trade name, manufactured by Rhodia Japan, Ltd.)

Examples 1 to 3

The (meth)acrylate (A), the radical polymerization initiator (B), e-IR-1 obtained in Reference Example 1, and the curing accelerator (D) were added to a vessel according to the formulation shown in Table 1. They were mixed with a mixing blade at room temperature for 20 minutes to give a curable composition. The curable compositions were evaluated for properties by the aforementioned methods. The results are shown in Table 1.

Examples 4 to 6

Curable compositions were obtained and were evaluated for properties by the procedure of Examples 1 to 3, except that e-IR-1 was replaced with e-IR-2 obtained in Reference Example 2. The results are shown in Table 1.

Examples 7 to 9

Curable compositions were obtained and were evaluated for properties by the procedure of Examples 1 to 3, except that e-IR-1 was replaced with e-IR-3 obtained in Reference Example 3. The results are shown in Table 1.

TABLE 1

| Example | 1 | 2 | 3 | 4 | 5 | 6 | 7 | 8 | 9 |
|---|---|---|---|---|---|---|---|---|---|
| (Meth)acrylate (A) | 10 | 25 | 50 | 10 | 25 | 50 | 10 | 25 | 50 |
| Radical polymerization initiator (B) | 2 | 2 | 2 | 2 | 2 | 2 | 2 | 2 | 2 |
| Epoxidized polyisoprene (C) | | | | | | | | | |
| e-IR-1 | 90 | 75 | 50 | — | — | — | — | — | — |
| e-IR-2 | — | — | — | 90 | 75 | 50 | — | — | — |
| e-IR-3 | — | — | — | — | — | — | 90 | 75 | 50 |

TABLE 1-continued

| Example | 1 | 2 | 3 | 4 | 5 | 6 | 7 | 8 | 9 |
|---|---|---|---|---|---|---|---|---|---|
| Curing accelerator (D) | 2 | 2 | 2 | 2 | 2 | 2 | 2 | 2 | 2 |
| Compatibility | BB | BB | AA | AA | AA | AA | AA | AA | AA |
| Transparency | AA | AA | AA | AA | AA | AA | AA | AA | AA |
| Break strength (MPa) | 0.4 | 0.4 | 1.1 | 0.7 | 0.6 | 0.6 | 0.6 | 0.9 | 1.7 |
| Break elongation (%) | 92 | 98 | 133 | 48 | 58 | 126 | 87 | 96 | 130 |
| Hardness (JIS-A) | 27 | 32 | 51 | 50 | 45 | 38 | 35 | 43 | 51 |
| Water absorption (%) | 0.11 | 0.08 | 0.13 | 0.17 | 0.24 | 0.27 | 0.32 | 0.26 | 0.22 |

Comparative Examples 1 to 3

Curable compositions were produced and were evaluated for properties by the procedure of Examples 1 to 3, except that e-IR-1 was replaced an epoxidized polybutadiene (E-1800-6.5 (trade name), manufactured by NIPPON PETROCHEMICALS COMPANY, LIMITED, Mn=120, Mw=9200 (Mn and Mw in terms of polystyrene), epoxy number: 4.1 meq/g). The results are shown in Table 2.

TABLE 2

| Comparative Example | 1 | 2 | 3 |
|---|---|---|---|
| (Meth)acrylate (A) | 10 | 25 | 50 |
| Radical polymerization initiator (B) | 2 | 2 | 2 |
| Epoxidized polybutadiene | 90 | 75 | 50 |
| Curing accelerator (D) | 2 | 2 | 2 |
| Compatibility | AA | AA | AA |
| Transparency | AA | AA | AA |
| Break strength (MPa) | 17 | 16 | 23 |
| Break elongation (%) | 10 | 11 | 25 |
| Hardness (JIS-A) | 98 | 98 | 81 |
| Water absorption (%) | 0.50 | 0.41 | 0.44 |

The results shown in Table 1 establish that the curable compositions that contain the epoxidized polyisoprene (C) having the epoxy number specified in the invention are excellent in compatibility of the (meth)acrylate (A) and can give cured products with excellent elongation properties and rubber elasticity and superior transparency, flexibility and waterproofness.

On the other hand, the results given in Table 2 show that curable compositions that contain conventional epoxidized polybutadienes have low elongation and poor flexibility.

Industrial Applicability

The curable composition of the present invention shows high elongation and excellent rubber elasticity even in a cured state and has superior compatibility, transparency, waterproofness and flexibility, so that cracks and separation of cured products are reduced. Accordingly, the composition is suitable for use as adhesives, coating agents, encapsulating materials, inks, sealing materials and the like.

What is claimed is:

1. A curable composition comprising:
    (A) at least one compound selected from the group consisting of an acrylate monomer and a methacrylate monomer,
    (B) a radical polymerization initiator,
    (C) an epoxidized polyisoprene, and
    (D) a curing accelerator, wherein
    the curing accelerator (D) is a cationic photopolymerization initiator, and
    the epoxidized polyisoprene:
        is obtained by epoxidation of a polyisoprene which consists of isoprene units;
        comprises 0.15 to 2.5 meq/g of epoxy group; and
        has a number-average molecular weight of 15,000 to 200,000, determined by gel permeation chromatography, in terms of polystyrene.

2. The curable composition according to claim 1, wherein the epoxidized polyisoprene comprises 0.15 to 2.0 meq/g of epoxy group.

3. The curable composition according to claim 1, wherein the epoxidized polyisoprene has a number-average molecular weight of 15,000 to 50,000, determined by gel permeation chromatography, in terms of polystyrene.

4. The curable composition according to claim 1, wherein a mixing ratio by mass of the at least one compound selected from the group consisting of an acrylate monomer and a methacrylate monomer to the epoxidized polyisoprene is in the range from 10/90 to 90/10.

5. The curable composition according to claim 4 wherein the mixing ratio is in the range 10/90 to 50/50.

6. The curable composition according to claim 1, wherein the cationic photopolymerization initiator is at least one selected from the group consisting of an aromatic diazonium salt, an aromatic iodonium salts, an aromatic sulfonium salt and a metallocene compound.

7. The curable composition according to claim 1, wherein the curing accelerator (D) is present in amount of 0.01 to 20 parts by mass per 100 parts by mass of the epoxidized polyisoprene.

8. The curable composition according to claim 7, wherein the curing accelerator (D) is present in amount of 0.5 to 10 parts by mass per 100 parts by mass of the epoxidized polyisoprene.

9. The curable composition according to claim 1, further comprising at least one selected from the group consisting of a tackifier, a plasticizer, an antioxidant, an ultraviolet light absorber, a softening agent, an anti-foaming agent, a pigment, a dye, an organic filler and a perfume.

* * * * *